(12) United States Patent
Smith et al.

(10) Patent No.: US 8,913,370 B2
(45) Date of Patent: Dec. 16, 2014

(54) SWITCHGEAR SPOUT DESIGN

(71) Applicant: Eaton Corporation, Cleveland, OH (US)

(72) Inventors: James E. Smith, Pittsburgh, PA (US); Brad Robert Leccia, Bethel Park, PA (US); Steven Z. Chen, Moon Township, PA (US)

(73) Assignee: Eaton Corporation, Cleveland, OH (US)

( * ) Notice: Subject to any disclaimer, the term of this patent is extended or adjusted under 35 U.S.C. 154(b) by 251 days.

(21) Appl. No.: 13/727,731

(22) Filed: Dec. 27, 2012

(65) Prior Publication Data

US 2014/0185193 A1     Jul. 3, 2014

(51) Int. Cl.
    *H02B 13/00*      (2006.01)
    *H05K 5/02*      (2006.01)
    *H02B 11/04*      (2006.01)
    *H01H 33/04*      (2006.01)

(52) U.S. Cl.
     CPC .............. *H05K 5/0217* (2013.01); *H02B 11/04* (2013.01)
     USPC ........... 361/620; 361/605; 361/611; 361/614; 361/617; 218/7; 218/134; 218/119; 218/153; 324/536; 324/544; 324/551; 307/147; 307/151; 200/50.22; 200/50.24; 200/50.26; 200/289; 200/305; 174/142; 174/144; 174/152 R

(58) Field of Classification Search
     USPC ......... 361/605, 607, 611, 612, 614, 617, 620, 361/624, 638, 639, 648, 649, 650, 641, 652, 361/657; 218/7, 44, 118, 119, 120, 218/152–154, 134; 200/50.01–50.02, 200/50.22–50.26, 289, 305, 168 K, 48 R, 200/48 V, 144, 166 R; 307/147, 151; 324/523, 547, 552, 524, 551, 536, 544; 174/66, 67, 59, 60, 70 B, 72 B, 174/387–389, 142, 152 R, 144
See application file for complete search history.

(56) References Cited

U.S. PATENT DOCUMENTS

| | | | | |
|---|---|---|---|---|
| 3,188,413 A | * | 6/1965 | Netzel | 200/50.24 |
| 3,562,593 A | * | 2/1971 | Bould | 361/614 |
| 3,662,137 A | * | 5/1972 | Cleaveland | 200/289 |
| 3,691,332 A | * | 9/1972 | Sharp | 218/119 |
| 4,104,497 A | * | 8/1978 | Brealey | 200/305 |
| 4,118,755 A | * | 10/1978 | Davies et al. | 361/678 |
| 6,346,677 B1 | * | 2/2002 | Guillemette et al. | 174/142 |
| 6,433,557 B1 | * | 8/2002 | Rashkes et al. | 324/551 |
| 6,489,782 B1 | * | 12/2002 | Baier et al. | 324/551 |
| 6,504,382 B2 | * | 1/2003 | Smith et al. | 324/551 |
| 7,473,116 B2 | | 1/2009 | Dudhwala et al. | |
| 7,910,852 B2 | * | 3/2011 | Chen et al. | 218/153 |
| 2005/0190032 A1 | * | 9/2005 | Vrana et al. | 336/90 |
| 2007/0253124 A1 | * | 11/2007 | Zhou et al. | 361/2 |

* cited by examiner

*Primary Examiner* — Michail V Datskovskiy
(74) *Attorney, Agent, or Firm* — Eckert Seamans Cherin & Mellott, LLC; David C. Jenkins

(57) ABSTRACT

A spout assembly is provided. The spout assembly includes a spout and a spout base. The spout base has a cross-sectional area that is smaller than a spout sized to enclose an electrical switching apparatus electrical coupling. That is, the spout base includes a CT support surface with a cross-sectional area that is smaller than the spout cross-sectional area. Current transformers are disposed upon the spout base CT support surface.

22 Claims, 4 Drawing Sheets

SWITCHGEAR SPOUT DESIGN

BACKGROUND OF THE INVENTION

1. Field of the Invention

The disclosed concept relates to a switchgear spout that supports current transformers.

2. Background Information

Switchgear devices (e.g., without limitation, electrical switching apparatus, such as circuit switching devices and circuit interrupters such as circuit breakers, contactors, motor starters, motor controllers and other load controllers), are, typically, removably mounted in an electrical enclosure. That is, the switchgear device includes a housing assembly and an electrical switching apparatus. The switchgear device housing assembly defines an enclosure sized to enclose the electrical switching apparatus. Users prefer the switchgear housing assembly enclosure to have a minimal width. Users, however, have a greater tolerance for deeper (front to back) switchgear housing assembly enclosures.

For the sake of an example, hereinafter the switching device is described as a vacuum circuit interrupter assembly, but it is understood the disclosed concept may be utilized with other types of switching devices. A vacuum circuit interrupter assembly is generally "C" shaped. The vertical portion of the vacuum circuit interrupter assembly includes the vacuum circuit interrupter which has a housing enclosing a vacuum chamber with separable contacts therein. The horizontal "legs" of the vacuum circuit interrupter assembly includes conductors having electrical couplings at their distal ends. The electrical couplings, which may be identified as "finger clusters," have a relatively large cross-sectional area. The electrical couplings are structured to engage a conductive lug, which may be identified as a "stab," The stab is in electrical communication with either a line conductor or a load conductor.

The electrical switching apparatus further utilizes one or more current transformers to measure the amount of current flowing through the switchgear. Current transformers, generally, are devices that extend about, e.g. encircle, a conductor. That is, a current transformer includes an opening. The current transformers are, typically, disposed adjacent the switching, device. More specifically, the current transformers are typically disposed about a conductor directly coupled to the vacuum circuit interrupter electrical couplings. The current transformers are disposed on a current transformer support surface (hereinafter a "CT support surface") that extends about a non-conductive body, hereinafter identified as a "spout." That is, the spout extends through the current transformer opening. The spout has a cross-sectional area sufficient to accommodate the vacuum circuit interrupter electrical couplings which, as noted above, have a relatively large cross-sectional area.

This is a disadvantage, or problem, in that this configuration requires the current transformers to have a greater cross-sectional area than the spout which, in turn, has a greater cross-sectional area than the vacuum circuit interrupter electrical couplings. More specifically, this is a problem because the larger the current transformers, the wider the switchgear housing assembly enclosure is required to be. As noted above, it is desirable to provide a switchgear housing assembly enclosure with a minimal width. Further, it is noted that such spouts are a body that is unitary with the current transformer support surface because there is no need to have a CT support surface that is separable from the spout body.

There is, therefore, a need for a spout assembly having a portion with a reduced cross-sectional area that acts as the CT support surface. In such a configuration, there is a further need for the CT support surface to be separable from the spout body so that current transformers having an opening that is smaller than the spout cross-sectional area may be installed. There is a further need for a spout that may be used with existing vacuum circuit interrupters.

SUMMARY OF THE INVENTION

These needs, and others, are met by at least one embodiment of this invention which provides a spout assembly including a spout and a spout base. The spout base has a cross-sectional area that is smaller than a spout sized to enclose an electrical switching apparatus electrical coupling. That is, the spout base includes a CT support surface with a cross-sectional area that is smaller than the spout cross-sectional area. As the current transformers are disposed upon the spout base CT support surface, the current transformers may be constructed with a smaller cross-sectional area, and smaller width, than current transformers sized to be placed upon the spout.

In one exemplary embodiment, the spout assembly includes a spout, a spout base, and a conductor assembly. The spout includes a generally hollow body with a first end, a second end, and a mounting. The spout body has a first cross-sectional area. The spout base includes a body with a first end, a second end, a mounting, and a CT support surface. The spout base body CT support surface has a second cross-sectional area. The first cross-sectional area is sized to enclose an electrical switching apparatus electrical coupling. The second cross-sectional area is smaller than the first cross-sectional area and, in an exemplary embodiment, substantially smaller than the first cross-sectional area. The spout body mounting is coupled to the spout base body mounting. The conductor assembly includes a number of conductive bodies extending through the spout body and the spout base body. The spout base body CT support surface is structured to support a number of current transformers.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENTS

Figure 1:
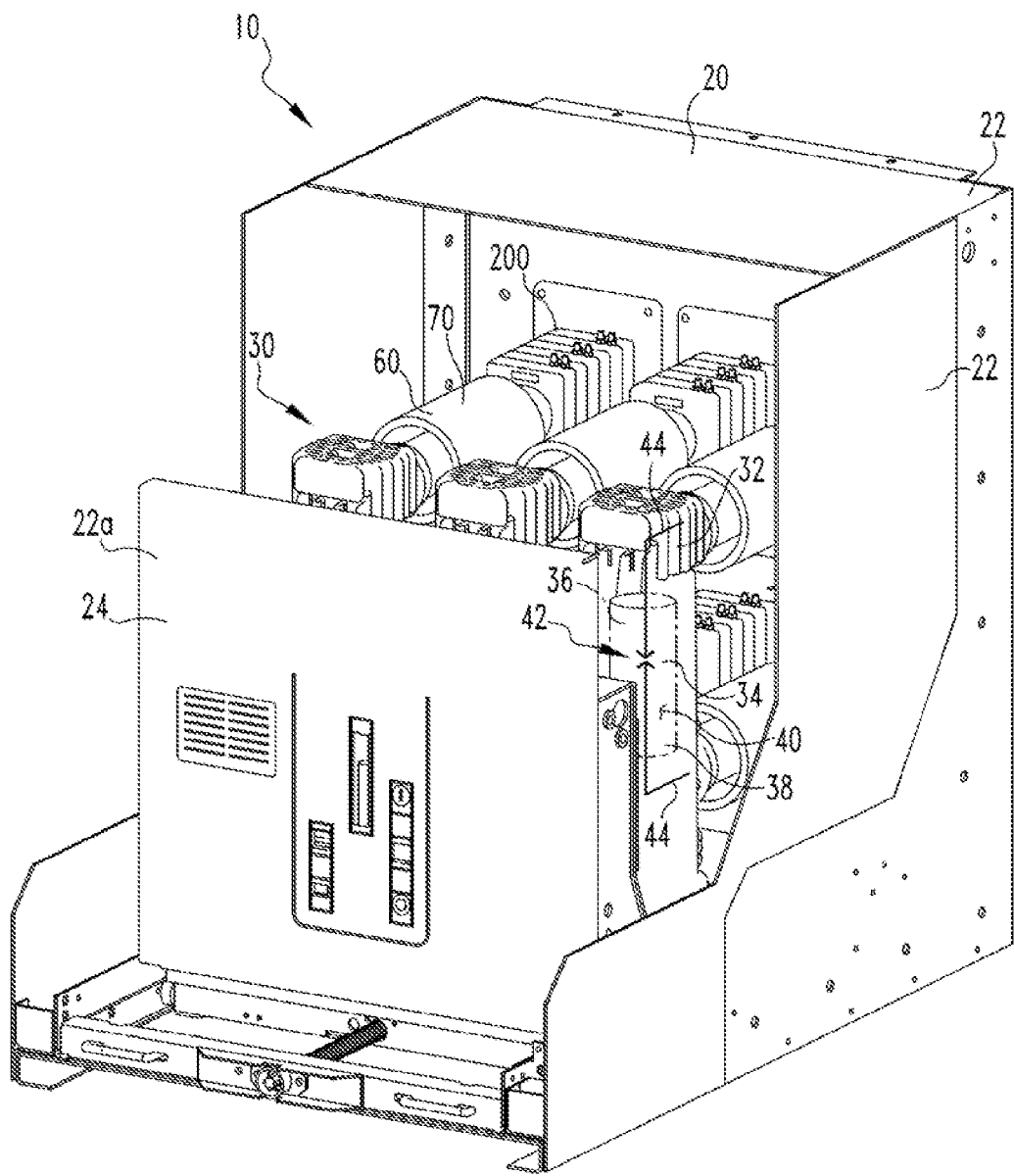
FIG. 1 is a schematic isometric view of a switchgear device.

As used herein, the singular form of "a," "an," and "the" include plural references unless the context clearly dictates otherwise. As used herein, the term "number," or "a number," shall mean one or an integer greater than one (i.e., a plurality).

As used herein, the statement that two or more parts or components are "coupled" shall mean that the parts are joined or operate together either directly or indirectly, i.e., through one or more intermediate parts or components, so long as a link occurs. As used herein, "directly coupled" means that two elements are directly in contact with each other. As used herein, "fixedly coupled" or "fixed" means that two components are coupled so as to move as one while maintaining a constant orientation relative to each other. Similarly, two or more elements disposed in a "fixed relationship" means that two components maintain a substantially constant orientation relative to each other.

As used herein, the word "unitary" means a component is created as a single piece or unit. That is, a component that includes pieces that are created separately and then coupled together as a unit is not a "unitary" component or body. As employed herein, the statement that two or more parts or components "engage" one another shall mean that the parts exert a force against one another either directly or through one or more intermediate parts or components.

Directional phrases used herein, such as, for example and without limitation, top, bottom, left, right, upper, lower, front, back, and derivatives thereof, relate to the orientation of the elements shown in the drawings and are not limiting upon the claims unless expressly recited therein.

As used herein. "correspond" indicates that two structural components are similar in size, shape or function. With reference to one component being inserted into another component or into an opening in the other component, "corresponding" means components are sized to engage or contact each other with a minimum amount of friction. Thus, an opening which corresponds to a member is sized slightly larger than the member so that the member can pass through the opening with a minimum amount of friction. This definition is modified if the two components are said to fit "snugly" together. In that situation, the difference between the size of the components is even smaller whereby the amount of friction increases.

As used herein, a "coupling" or a "coupling component" is one element of a coupling assembly. That is, a coupling assembly includes at least two elements, or components, that are structured to be coupled together. It is understood that the elements of a coupling assembly correspond to each other or are otherwise structured to be joined together. For example, in a coupling, assembly, if one coupling element is a bolt, the other coupling element is a nut. Further, it is understood that the two elements of a coupling assembly may not be described at the same time. Further, it is understood that, unless otherwise noted, the locations of two coupling components may be reversed. For example, if the coupling assembly includes a first coupling component, e.g. a lug, disposed on one element and a second coupling component, e.g. a socket, disposed on another element, the locations of the first and second coupling components may be reversed.

As used herein, "at" means on or near.

As shown in FIG. 1, a switchgear device 10 includes a housing assembly 20, a number of electrical switching apparatuses 30, and a spout assembly 60. The housing assembly 20 includes a number of sidewalls 22 which define a substantially enclosed space, i.e. an enclosure 22. The housing assembly includes a movable carriage 24 that is structured to move in and out of the enclosure 22. That is, the carriage 24 moves between a first withdrawn position and a second inserted position. A front sidewall 22A is directly coupled to the carriage 24 and moves therewith.

As used herein an "electrical switching apparatus" shall mean circuit switching devices and circuit interrupters such as circuit breakers, contactors, motor starters, motor controllers and other load controllers. For the sake of an example, the electrical switching apparatus 30 shown schematically in the figures is a vacuum circuit interrupter 32. It is understood that any description of the vacuum circuit interrupter assembly 32 is applicable to other electrical switching apparatus 30 as well. It is further understood that the housing assembly 20 may enclose a plurality of electrical switching apparatuses 30; as shown in FIG. 1, there are three electrical switching apparatuses 30. It is understood, however, that any number of electrical switching apparatuses 30 may be enclosed by the housing assembly 20. The following description shall address a single electrical switching apparatus 30; it is understood that the description is applicable to the other electrical switching apparatuses 30 as well.

Figure 2:
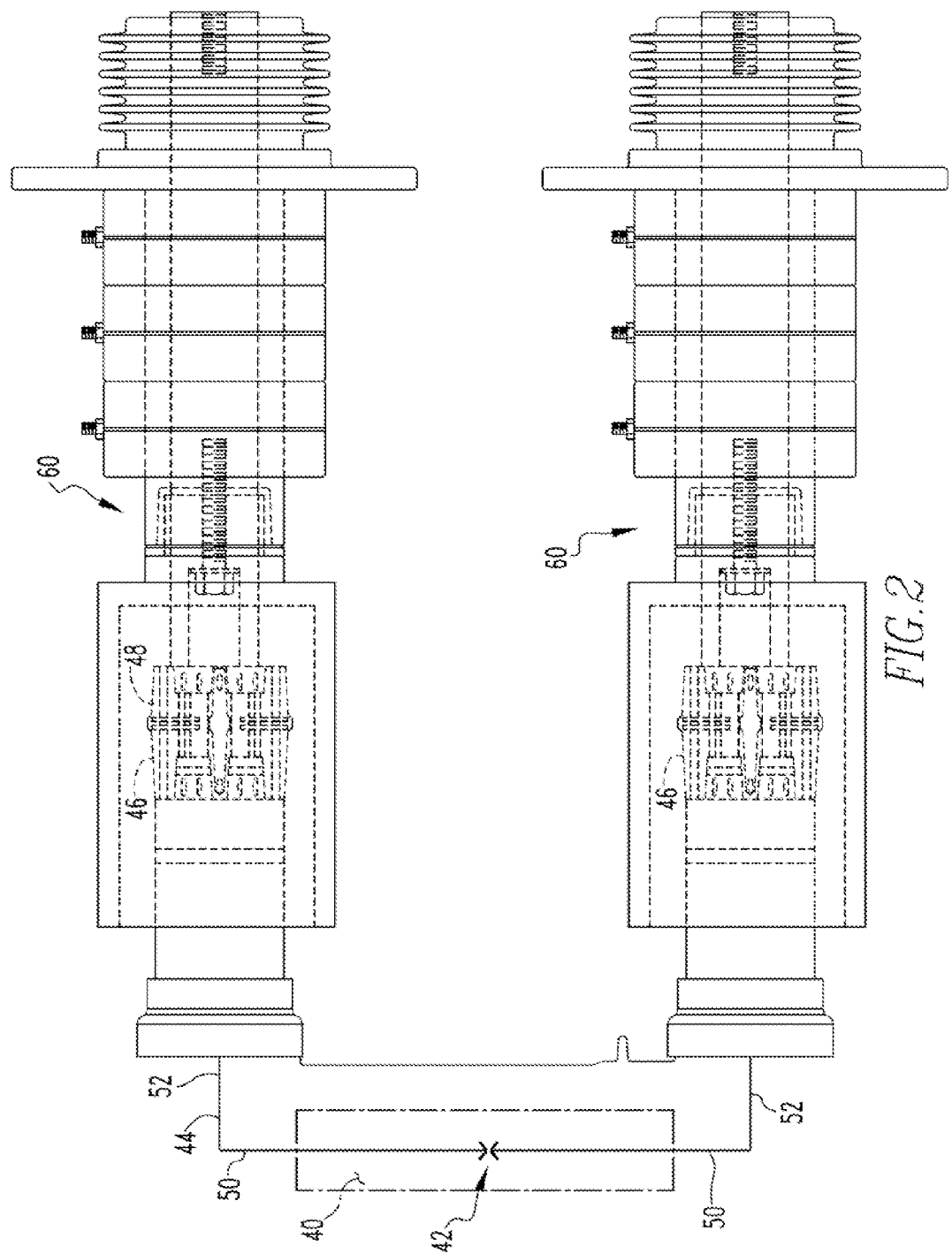
FIG. 2 is a side view of a switchgear device including a spout assembly.

The vacuum circuit interrupter assembly 32 includes a switching device 34 and a number of spout assemblies 60. The vacuum circuit interrupter assembly 32 includes an elongated vacuum circuit interrupter 36 (shown schematically). The vacuum circuit interrupter 36 includes a housing 38 defining a vacuum chamber 40, pair of separable contacts 42, shown schematically, a number of conductive buses 44, and two electrical couplings 46 (FIG. 2). The pair of separable contacts 42 are disposed within the vacuum chamber 40. Each of the separable contacts 42 are coupled to, and in electrical communication with a conductive bus 44. Each conductive bus 44 is coupled to, and in electrical communication with an electrical coupling 46. That is, the electrical coupling 46 is disposed at the end of the conductive bus 44 opposite the separable contacts 42. The electrical coupling 46 has a cross-sectional area that is larger than the cross-sectional area of the conductive bus 44. In an exemplary embodiment, each electrical coupling 46 is a generally circular finger cluster 48 having an outer diameter of between about 3.0 and 8.0 inch, and more specifically about 5.0 inch.

In an exemplary embodiment, shown in FIG. 2, the vacuum circuit interrupter 36 is disposed in a vertical orientation. The conductive buses 44 each have first elongated portion 50 and a second elongated portion 52. Each conductive bus first elongated portion 50 extends generally along, or parallel to, the longitudinal axis of the vacuum circuit interrupter 36. That is, each conductive bus first elongated portion 50 extends generally vertically. Each conductive bus 44 includes a generally ninety-degree bend so that each conductive bus second elongated portion 52 extends generally horizontally. Each conductive bus second elongated portion 52 includes the electrical coupling 46. The conductive bus second elongated portions 52 extend generally parallel to each other. In this configuration, the vacuum circuit interrupter 36 has a generally "S" shaped appearance or, more specifically a "[," i.e. a square bracket, shaped appearance.

Figure 3:
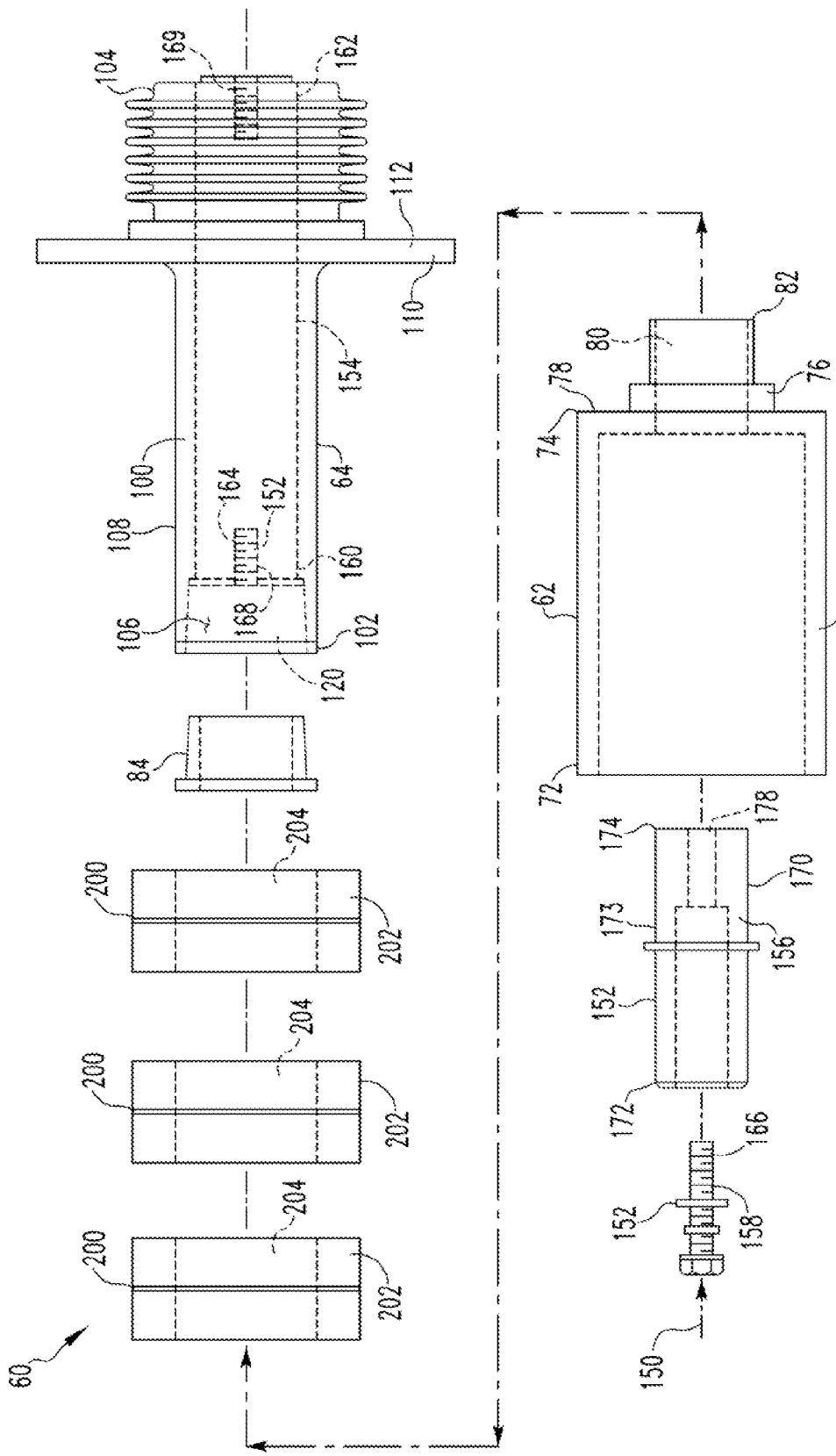
FIG. 3 is an exploded view of one embodiment of a spout assembly.
Figure 4:
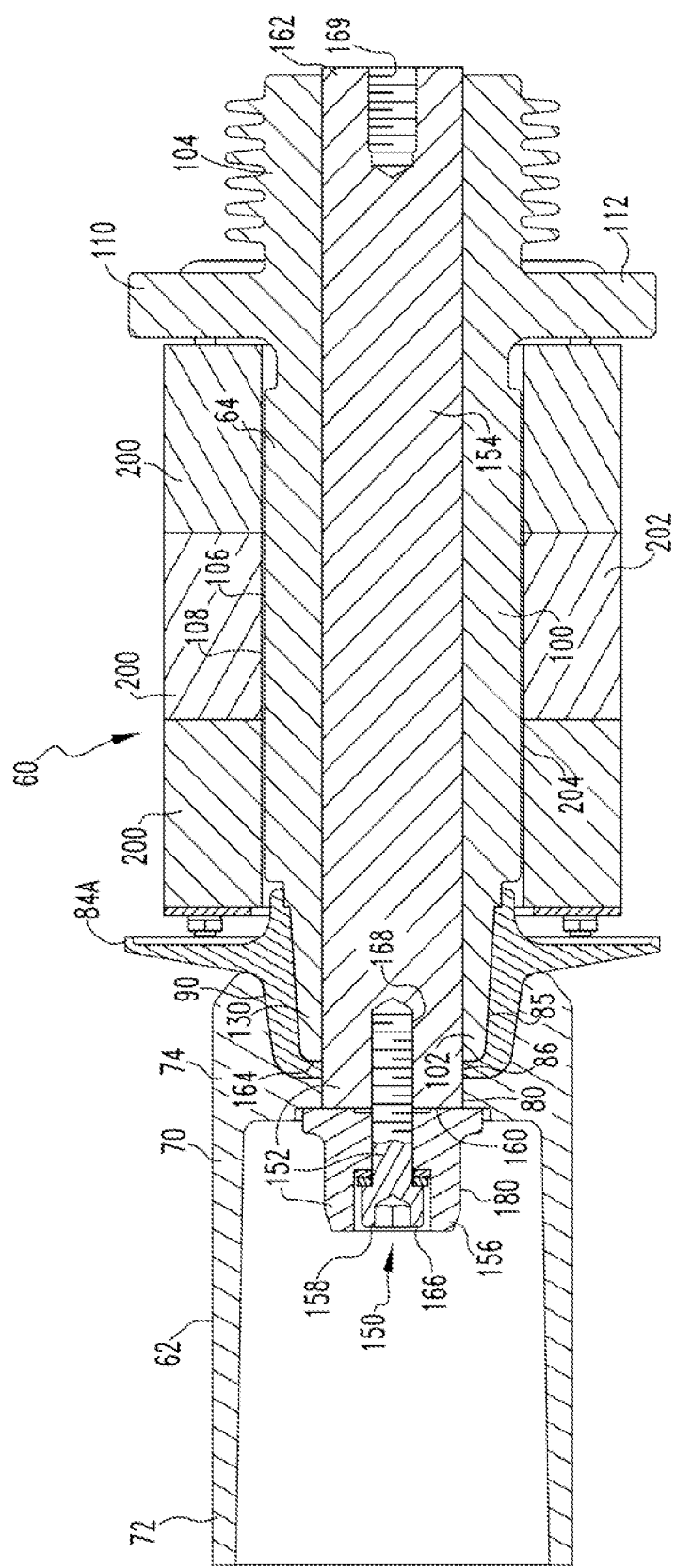
FIG. 4 is a cross-sectional view of another embodiment of a spout assembly.

Each spout assembly 60 is substantially similar so only one will be described. A spout assembly 60 may be coupled to any of the electrical couplings 46. As shown in FIGS. 3 and 4, which show two different embodiments of a spout assembly 60, the spout assembly 60 includes a spout 62, a spout base 64, and a conductor assembly 150. In an exemplary embodiment, the spout 62 and spout base 64 are not unitary. The lack of a unitary body is required for the exemplary embodiment in that the spout body 70 (described below) and the spout base body flange 110 (described below) have a larger cross-sectional area than the openings in the current transformers 200 (described below). Thus, the spout body 70 and the spout base body 100 (described below) must be separable in order to install the current transformers 200 on the spout base body 100. In an alternate embodiment, not shown, the spout 62 and spout base 64 are unitary and the spout base body flange 110 is separable from the spout base body 100.

The spout 62 includes a generally hollow, non-conductive body 70 with a first end 72, a second end 74, and a mounting 76. As used herein, the spout body 70 is the body that is disposed about electrical couplings 46. Further, with regard to the disclosed concept, as used herein concept, the outer surface of the spout body 70 is not a CT support surface. The spout body first end 72 is open. In one embodiment, shown in FIG. 3, the spout body second end 74 is substantially closed by a generally planar member 78 having a passage 80. The spout body passage 80 is, in an exemplary embodiment, centrally disposed on the spout body planar member 78. Further, in this exemplary embodiment, the spout body mounting 76 is a generally circular collar 82 that extends outwardly from the spout body planar member 78 and which is disposed about the spout body passage 80. The passage 80 extends through the collar 82. The spout body mounting 76 may also include a gasket 84 that may be made from a resilient material. The gasket 84 is structured to fit over the radial surface of collar 82, i.e. the gasket 84 does not block the passage 80. As discussed below, the spout body mounting 76, as well as the gasket 84, fits within a spout base body mounting 106 and, more specifically, a spout base body socket 120.

In an alternate exemplary embodiment, shown in FIG. 4, the spout body second end 74 defines an inwardly extending socket 90. In this embodiment, the spout body second end 74 also includes a passage 80. Further, in this embodiment, the spout body mounting 76 may also include a stress cone 84A that may be made from a resilient material similar to gasket 84. The stress cone 84A is shaped, generally, as a truncated cone or cup and includes a cavity 85 and a central passage 86. The stress cone central passage 86 aligns with the spout body second end passage 80. The stress cone 84A is structured to fit within the spout body second end socket 90. As discussed below, in this embodiment, the spout base body mounting 106 is an outwardly extending collar that fits within the stress cone 84A and the spout body second end socket 90.

In both embodiments, the spout body 70 has a first cross-sectional area. The spout body 70 is structured to be disposed about an electrical coupling 46. Thus, the first cross-sectional area is larger than the electrical coupling 46 cross-sectional area.

The spout base 64 includes an elongated, non-conductive body 100. The spout base body 100 is a substantially solid body, with the exception of a passage for a conductor, as discussed below. The spout base body 100 includes a first end 102, a second end 104, a mourning 106, and a CT support surface 108. In an exemplary embodiment, the spout base body 100 also includes a flange 110. The spout base body CT support surface 108 defines a generally circular surface. The spout base body CT support surface 108 has a second cross-sectional area. In an exemplary embodiment, the CT support surface 108 has a diameter of between about 3.0 inches and 5.0 inches and more specifically about 3.9 inches. The spout base body CT support surface 108 is structured to support a number of current transformers 200. Thus, the current transformers 200 have a cross-sectional area that is greater than the second cross-sectional area. So as to minimize the current transformers' 200 cross-sectional area thereby allowing the current transformers' 200 cross-sectional area to be reduced relative to a current transformer structured to be disposed about a spout body 70, the second cross-sectional area is smaller than the first cross-sectional area and, in an exemplary embodiment, substantially smaller than the first cross-sectional area. As used herein, a "substantially smaller" cross-sectional area means that the second cross-sectional area is between about 30% and 85% of the first cross-sectional area. In a specific exemplary embodiment, the second cross-sectional area is about 50% of the first cross-sectional area.

The spout base body flange 110 is a planar member 112 disposed at the spout base body second end 104. The spout base body flange 110 is structured to be coupled to the housing assembly 20. For example, the spout base body flange 110 may include an opening through which a nut and a bolt may be passed.

As there are two embodiments of the spout body mounting 76, there are two corresponding embodiments of the spout base body mounting 106. In a first exemplary embodiment, FIG. 3, the spout base body first end 102 defines a socket 120. The spout base body socket 120 is sized to accommodate, and correspond to, the spout body mounting 76 as well as the gasket 84. That is, collar 82 and gasket 84 fit within, and in one exemplary embodiment snuggly within, the spout base body socket 120. Thus, when the spout assembly 60 is assembled, the collar 82 within the spout base body socket 120 with the gasket 84 is disposed between the collar 82 and the spout base body socket 120.

In an alternate exemplary embodiment, FIG. 4, wherein the spout body mounting 76 is an inwardly extending socket 90, the spout base body mourning 106 is a portion of the spout base body 100 that extends beyond the spout base body CT support surface 108. Hereinafter, this portion of the spout base body 100 is identified as the first end extension 130. The first end extension 130 is sized to correspond to the spout body second end socket 90. More specifically, the first end extension 130 is sized to correspond to the stress cone cavity 85. Thus, when the spout assembly 60 is assembled, the first end extension 130 is within, and in one exemplary embodiment snuggly within, the stress cone cavity 85 and the stress cone 84A is within, and in one exemplary embodiment snuggly within, the spout body second end socket 90.

The conductor assembly 150 includes a number of conductive bodies 152 and extends through the spout body 70 and the spout base body 100. In an exemplary embodiment, the conductor assembly 150 includes an elongated bus member 154, a stab 156, and a first coupling component 158. The bus member 154 has a first end 160 and a second end 162. The bus member first end 160 includes a second coupling component 164. In the embodiment shown in the figures, the first coupling component 158 is a bolt 166 and the second coupling component 164 is a threaded bore 168. It is understood that the first coupling component 158 could be a nut (not shown) and the second coupling component 164 could be a threaded rod (not shown), or another type of coupling could be used. The bus member second end 162 may also include a coupling component 169 structured to be coupled to a line or load conductor (neither shown). As noted above, the bus member 154 is disposed within a passage defined by the spout base body 100. In an exemplary embodiment, the spout base body 100 is an epoxy that is molded about the bus member 154.

There are two embodiments of the stab 156, each associated with one embodiment of the spout body mounting 76 and spout base body mounting 106 described above. When the spout base body first end 102 defines a socket 120, the stab 156 is an elongated tubular member 170 having a first end 172, a medial portion 173, and a second end 174. The tubular member second end 174 includes an axial member 176 having, an opening 178. When the spout assembly 60 is assembled the tubular member 170 is partially disposed within the spout body 70 and partially disposed within the spout base body 100. More specifically, the tubular member first end 102 is disposed in the spout body 70. The tubular member medial portion 173 is disposed within the collar $2 and, when the spout assembly 60 is assembled, the spout base body socket 120. The tubular member second end 174 extends through the passage 80. The tubular member second end 174 is disposed within the spout base body socket 120. The tubular member second end 174 is coupled to, and in electrical communication with, the bus member first end 160.

The first coupling component 158, e.g. bolt 166, extends through tubular member second end opening 178 as well as passage 80 and is coupled to the second coupling component 164. Further, the tubular member first end 172 is structured to be engaged by the electrical coupling 46. As shown in FIG. 2, electrical coupling 46 is coupled to, and in electrical communication with, the tubular member first end 172.

In the alternate embodiment wherein the spout body mounting 76 is an inwardly extending socket 90, shown in FIG. 4, the stab 156 is lug 180 disposed within the spout body 70 in this embodiment, and the bus member first end 160 extends through first end extension 130. As described above, first end extension 130, when the spout assembly 60 is assembled, is within the stress cone cavity 85 and the stress cone 84A is within the spout body second end socket 90. In this configuration, first coupling component 158, e.g. bolt 166, extends through stress cone central passage 86 as well as passage 80 and is coupled to the second coupling component 164. Further, the lug 180 is structured to be engaged by the electrical coupling 46. As shown in FIG. 2, electrical coupling 46 is coupled to, and in electrical communication with, the lug 180. Thus, in both embodiments, the stab 156 is structured to be coupled to, and in electrical communication with, the electrical switching apparatus electrical coupling 46 and the bus member 154. It is further noted that the conductor assembly 150 must be separable for the reasons set forth above regarding the spout 62 and spout base 64 being non-unitary.

As shown in FIGS. 3 and 4, the spout base body CT support surface 108 is longitudinally spaced from the spout body 70. That is, using the axis of the elongated spout base body 100 as a reference, the spout base body CT support surface 108 is spaced from the spout body 70, i.e. the spout base body CT support surface 108 is not disposed on the spout body 70. A number of current transformers 200 may be disposed on the spout base body CT support surface 108. The current transformers 200 include a body 202 having an opening 204. The current transformers bodies 202 have a cross-sectional area. The current transformer openings 204 are sized to correspond to the spout base body CT support surface 108. Thus, in an exemplary embodiment, the current transformer openings 204 are generally circular. Moreover, the current transformers bodies 202 cross-sectional area is affected by the size of the current transformer openings 204. That is, the larger the current transformer openings 204, the larger the current transformers 200 must be. Thus, in the disclosed embodiments, the current transformers 200 have a smaller cross-sectional area than would a current transformer disposed about a spout body 70. That is, the spout base body CT support surface 108, as set forth above, always has a smaller cross-sectional area than a spout body 70. Thus, the current transformers 200 disposed about the spout base body CT support surface 108 have a smaller cross-sectional area than would a similar current transformer disposed about a spout body 70.

Accordingly, the current transformers 200 have a width. As used herein, a "width" is the length of a cross-sectional area in a horizontal direction and more specifically, a horizontal direction extending laterally across the housing assembly 20. As shown in FIG. 3, having the second cross-sectional area, i.e. the spout base body CT support surface 108 cross-sectional area, be smaller, and in one exemplary embodiment substantially smaller, than first cross-sectional area, i.e. the spout body cross-sectional area, allows the current transformers 200 to have a width that is substantially equal to, or less than, the width of the spout body 70. As shown in FIG. 4, in the alternate exemplary embodiment, the current transformers 200 have a width that is slightly larger than the width of the spout body 70. As used herein, "slightly larger" means no more than 30% larger. As a specific example, a spout body 70 may have an outer surface diameter of about 3.5 inches and the current transformers 200 may have a width of about 7.0 inches. It is noted that the current transformers 200 are shown as having a square cross-sectional shape. As is known, the operative portion of the current transformers 200 is generally torus shaped and disposed inside a square housing. The housing may be used as a mounting to couple the current transformers 200 to each other or another element. It is understood that the current transformers 200 are oriented so that a substantially minimal width is provided. That is, the current transformers 200 are not oriented with corners in a horizontal plane that includes the spout base longitudinal axis, i.e. rotated 45 degrees from the orientation shown in the figures. It is further understood that the current transformers 200 may have other cross-sectional shapes including generally circular. If the current transformers 200 are generally circular, the width is the outer diameter.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of invention which is to be given the full breadth of the claims appended and any and all equivalents thereof.

What is claimed is:

1. A spout assembly for an electrical switching apparatus, said electrical switching apparatus including an electrical coupling having a cross-sectional area, said spout assembly comprising:
   a spout including a generally hollow body with a first end, a second end, and a mounting, said spout body having a first cross-sectional area, said spout body mounting disposed at said spout body second end;
   a spout base including a body with a first end, a second end, a mounting, and a CT support surface, said spout base body CT support surface having a second cross-sectional area, said spout base body mounting disposed at said spout body first end;
   said first cross-sectional area sized to enclose said electrical switching apparatus electrical coupling;
   wherein said second cross-sectional area is substantially smaller than said first cross-sectional area;
   said spout body mounting coupled to said spout base body mounting;
   a conductor assembly, said conductor assembly having a number of conductive bodies extending through said spout body and said spout base body; and
   said spout base body CT support surface structured to support a number of current transformers.

2. The spout assembly of claim 1 wherein said spout base body CT support surface is longitudinally spaced from said spout body.

3. The spout assembly of claim 1 wherein said spout base body CT support surface is not unitary with said spout.

4. The spout assembly of claim 1 wherein said spout base body CT support surface is generally circular and has a radius of between about 3.0 inches and about 5.0 inches.

5. The spout assembly of claim 4 wherein said spout base body CT support surface has a radius of about 3.9 inches.

6. The spout assembly of claim 1 wherein:
   said conductor assembly includes a stab and a bus member; and
   said stab structured to be coupled to said electrical switching apparatus electrical coupling and said bus member.

7. A spout assembly for an electrical switching apparatus, said electrical switching apparatus including; an electrical coupling having a cross-sectional area, said spout assembly comprising:
- a spout including a generally hollow body with a first end, a second end, and a mounting, said spout body having a first cross-sectional area, said spout body mounting disposed at said spout body second end;
- a spout base including a body with a first end, a second end, a mounting, and a CT support surface, said spout base body CT support surface having a second cross-sectional area, said spout base body mounting disposed at said spout body first end;
- said first cross-sectional area sized to enclose said electrical switching apparatus electrical coupling;
- wherein said second cross-sectional area is substantially smaller than said first cross-sectional area;
- said spout body mounting coupled to said spout base body mounting;
- a conductor assembly, said conductor assembly having a number of conductive bodies extending through said spout body and said spout base; and
- a number of current transformers disposed on said spout base mounting surface.

8. The spout assembly of claim 7 wherein said spout base body CT support surface is longitudinally spaced from said spout body.

9. The spout assembly of claim 7 wherein said spout base body CT support surface is not unitary with said spout.

10. The spout assembly of claim 7 wherein said current transformers have a width, wherein each said current transformer width is substantially equal to, or less than, the width of said spout body.

11. The spout assembly of claim 7 wherein said current transformers have a width, wherein each said current transformer width is slightly larger than the width of said spout body.

12. The spout assembly of claim 7 wherein:
- said spout base body CT support surface is generally circular; and
- each said current transformer includes a body having a generally circular opening, each said current transformer opening sized to correspond to said spout base body CT support surface.

13. The spout assembly of claim 12 wherein said has spout base body CT support surface a radius of between about 3.0 inches and about 5.0 inches.

14. The spout assembly of claim 13 wherein said spout base body CT support surface has a radius of about 3.9 inches.

15. A switchgear device comprising:
- a housing assembly defining an enclosure;
- a number of electrical switching apparatuses, each electrical switching apparatus including an electrical coupling having a cross-sectional area;
- a spout assembly including a spout and a spout base;
- said spout including a generally hollow body with a first end, a second end, and a coupling, said spout body having a first cross-sectional area, said spout body mounting disposed at said spout body second end;
- said spout base including a body with a first end, a second end, a coupling, and a mounting surface, said spout base body CT support surface having a second cross-sectional area, said spout base body mounting disposed at said spout body first end;
- said first cross-sectional area sized to enclose said electrical switching apparatus electrical coupling;
- wherein said second cross-sectional area is substantially smaller than said first cross-sectional area;
- said spout body mounting coupled to said spout base body mounting;
- a conductor assembly, said conductor assembly having a number of conductive bodies extending through said spout body and said spout base; and
- a number of current transformers disposed on said spout base mounting surface.

16. The switchgear device of claim 15 wherein said spout base body CT support surface is longitudinally spaced from said spout body.

17. The switchgear device of claim 15 wherein said spout base body CT support surface is not unitary with said spout.

18. The switchgear device of claim 15 wherein said current transformers have a width, wherein each said current transformer width is substantially equal to, or less than, the width of said spout body.

19. The switchgear device of claim 15 wherein said current transformers have a width, wherein each said current transformer width is slightly larger than the width of said spout body.

20. The switchgear device of claim 15 wherein:
- said spout base body CT support surface is generally circular; and
- each said current transformer includes a body having a generally circular opening, each said current transformer opening sized to correspond to said spout base body CT support surface.

21. The switchgear device of claim 20 wherein said has spout base body CT support surface a radius of between about 3.0 inches and about 5.0 inches.

22. The switchgear device of claim 20 wherein said spout base body CT support surface has a radius of about 3.9 inches.

* * * * *